US006992602B2

(12) United States Patent
Alexander et al.

(10) Patent No.: US 6,992,602 B2
(45) Date of Patent: Jan. 31, 2006

(54) JOYSTICK CONTROLLER

(75) Inventors: Alfred John Alexander, Gwent (GB); Anthony Keith Atwell, Gwent (GB); Colin Topping, Mid Glamorgan (GB); Richard Phillip Dent, Lower Lydbrook (GB)

(73) Assignee: Penny & Giles Controls Limited, West Sussex (GB)

( * ) Notice: Subject to any disclaimer, the term of this patent is extended or adjusted under 35 U.S.C. 154(b) by 331 days.

(21) Appl. No.: 10/221,820

(22) PCT Filed: Feb. 21, 2001

(86) PCT No.: PCT/GB01/00710

§ 371 (c)(1),
(2), (4) Date: Dec. 30, 2002

(87) PCT Pub. No.: WO01/69343

PCT Pub. Date: Sep. 20, 2001

(65) Prior Publication Data

US 2003/0107502 A1 Jun. 12, 2003

(30) Foreign Application Priority Data

Mar. 17, 2000 (GB) .................................... 0006350

(51) Int. Cl.
*H03K 17/94* (2006.01)

(52) U.S. Cl. ............................ 341/22; 341/9; 318/560

(58) Field of Classification Search .................. 341/20, 341/33, 9; 345/161, 156, 167; 318/560, 318/128

See application file for complete search history.

(56) References Cited

U.S. PATENT DOCUMENTS

| | | | | |
|---|---|---|---|---|
| 3,776,058 | A | 12/1973 | French | |
| 4,459,578 | A | 7/1984 | Sava et al. | |
| 4,660,828 | A | 4/1987 | Weiss | |
| 4,855,704 | A | 8/1989 | Betz | |
| 5,576,704 | A | 11/1996 | Baker et al. | |
| 5,692,541 | A | 12/1997 | Brown | 137/636.2 |
| 6,580,418 | B1 * | 6/2003 | Grome et al. | 345/161 |

FOREIGN PATENT DOCUMENTS

| | | |
|---|---|---|
| WO | WO 9719440 | 5/1997 |

* cited by examiner

*Primary Examiner*—Michael Horabik
*Assistant Examiner*—Hung Dang
(74) *Attorney, Agent, or Firm*—Wells St. John P.S.

(57) ABSTRACT

A joystick controller has a body (10), an operating shaft (12) and a ball-and-socket joint (14) mounting the operating shaft for universal pivotal movement relative to the body (10) about a pivot center. First and second and third carrier members (16, 17, 19) are movable relative to the body (10) about respective first, second and third, mutually perpendicular axes which pass through the pivot center of the ball-and-socket joint (14), and carry respective magnets (24, 26, 29). Rotary movement of the operating shaft (12) about its longitudinal axis causes movement of the third carrier member (19) about the third axis. Hall-effect devices (52, 54, 56) are mounted on a common planar circuit board (48) at the base of the body (10) and producing respective output signals indicative of the positions of the magnets (24, 26, 29) carried on the first, second and third carrier members (16), respectively.

31 Claims, 6 Drawing Sheets

JOYSTICK CONTROLLER

PRIORITY CLAIM

This application is a 35 U.S.C. §371 of PCT International Application Number PCT/GB01/00710, which was filed 21 Feb. 2001 (22.02.01), and was published in English.

This invention relates to a joystick controller and more particularly to a joystick controller utilising a non-contact principle for sensing joystick position, for example utilising a Hall or other magnetic proximity effect device.

It is an object of the present invention to provide an improved joystick controller which is capable of being produced in a cost-effective manner and which can be made in suitably miniaturised form and of high strength for use in rugged industrial applications and, in particular, also for use on a wheel chair.

According to a first aspect of the present invention, there is provided a joystick controller comprising:

a body;

an operating shaft having a longitudinal axis;

a ball-and-socket joint mounting the operating shaft for universal pivotal movement relative to the body about a pivot centre;

a first member mounted for movement by the operating shaft relative to the body about a first axis;

a second member mounted for movement by the operating shaft relative to the body about a second axis which is substantially perpendicular to the first axis;

a third member mounted for movement relative to the body about a third axis substantially perpendicular to the first and second axes upon rotation of the operating shaft about its longitudinal axis; first detecting means for producing an output signal indicative of the position of the first member about the first axis;

second detecting means for producing an output signal indicative of the position of the second member about the second axis; and third detecting means for producing an output signal indicative of the position of the third member about the said third axis;

wherein the first, second and third detecting means are fixed relative to the body.

The output signal produced by the third detecting means enables a third degree of control to be achieved simply by rotation of the operating shaft about its longitudinal axis. Thus, it is possible to avoid the trouble and expense of providing an additional control on top of the operating shaft with associated lead wires passing along the operating shaft requiring shielding and protection against damage and wear and tear, and also associated connections.

It is within the scope of the present invention for the rotatable operating shaft to take the form of an inner shaft which is rotatable in bearings within an outer tube which is non-rotatable but which is pivotable with the operating shaft about the first and second axes. However, it is preferred to avoid the additional expense which this entails by having a single operating shaft which is manually pivoted in the first and second axes to effect the first and second degrees of control and which is rotated about its own longitudinal axis to effect the third degree of control.

The means for mounting the operating shaft preferably comprises a ball-and-socket joint, in which part of the ball-and-socket joint is prefereably movable with the operating shaft about the longitudinal axis of the latter and forms part of connecting means operatively connecting the operating shaft with the third member.

The connecting means may comprise an interengaging pin and groove arrangement, or a pair of interengaging pin and groove arrangements which are disposed on diametrically opposite sides of the ball-and-socket joint. The groove of the or each pin and groove arrangement is preferably provided in the ball.

The connecting means is arranged so that movement of the third member about the third axis is independent of the position of the operating shaft (12) in relation to the first and second axes.

Whilst it is within the scope of the present invention for the operating shaft to be connected with the socket of the ball-and-socket joint so that the socket is pivotable relative to the body on a fixed ball about the pivot centre when the operating shaft is moved, it is preferred for the ball of the ball-and-socket joint to be movable with the operating shaft about the longitudinal axis of the latter.

Preferably, the operating shaft is rotatable by approximately 20° either side of a neutral rotary position.

Preferably, stop means are provided for limiting rotary movement of the shaft on either side of the neutral rotary position.

Preferably, means are provided for resiliently restoring the operating shaft to its neutral rotary position after rotary movement of said shaft.

Preferably, the resilient restoring means includes a return spring. More preferably, the return spring is curved so as to extend around the longitudinal axis of the operating shaft and has opposite ends which engage with the third member.

In a preferred embodiment, at least one, and preferably all, of the first, second and third detecting means is/are non-contact detecting means preferably comprising first, second and third magnets mounted, respectively, on the first, second and third members, and first, second and third Hall effect, magneto-resistive or other magnetic field sensing devices in operative proximity to the respective first second and third magnets. Other field sensing devices such as electrical field sensing devices may be used, these including capacitance and induction devices.

Preferably, the first, second and third field sensing devices are mounted on a substantially planar support.

According to a second aspect of the present invention, there is provided a joystick controller comprising:

a body;

an operating shaft having a longitudinal axis;

means mounting the operating shaft for universal pivotal movement relative to the body;

a first member mounted for movement by the operating shaft relative to the body about a first axis;

a second member mounted for movement by the operating shaft relative to the body about a second axis which is substantially perpendicular to the first axis;

first detecting means for producing an output signal indicative of the position of the first member about the first axis; and second detecting means for producing an output signal indicative of the position of the second member about the second axis;

wherein said first and second detecting means are non-contact sensing devices mounted on a substantially planar support.

Preferably, the detecting means are mounted within a magnetically soft cup-shaped member or cover engaged with the body. With such an arrangement, the magnetic cup-shaped body or cover not only protects delicate parts within the body but also, being magnetically soft, acts as a pole piece to concentrate flux from the magnets to the respective devices, and further acts to shield the devices from external magnetic fields which might otherwise adversely affect operation of the devices. Additionally, such a magnetically soft cover also reduces the amount of magnetic flux emanating from the joystick controller.

Preferably, connecting means are provided for operatively connecting the operating shaft to the first second and third members and are preferably formed of an insulator or are insulated from the operating shaft to reduce radiated electromagnetic interference being conducted along the operating shaft to the outside environment and to minimise susceptibility of the magnetic field sensing devices to electromagnetic interference from the outside.

Conveniently, the construction of the joystick provides a defined path for electrostatic discharge currents from the operating handle, the operating shaft, the magnetic cover or other externally contactable parts to an earthing conductor which prevents these currents from reaching the magnetic field sensing devices, but which includes a spark gap or other voltage-dependent breakdown device to maintain low voltage electrical isolation between these parts and the earthing conductor.

Preferably, means are provided for resiliently restoring the operating shaft to a neutral position about the axis of the ball, said means comprising a member slidable on the shaft and having a frusto-conical surface resiliently urged against an annular formation on the body.

The resilient restoring means preferably has a metallic liner so as to provide an accurate low backlash sliding fit with the operating shaft under normal operating environmental conditions, particularly temperature extremes.

Embodiments of the present invention will now be described, by way of example, with reference to the accompanying drawings, in which FIG. 1 is an underneath plan view of a joystick controller according to the first aspect of the present invention shown with a magnetic cover and printed circuit board thereof removed;

Figure 1:
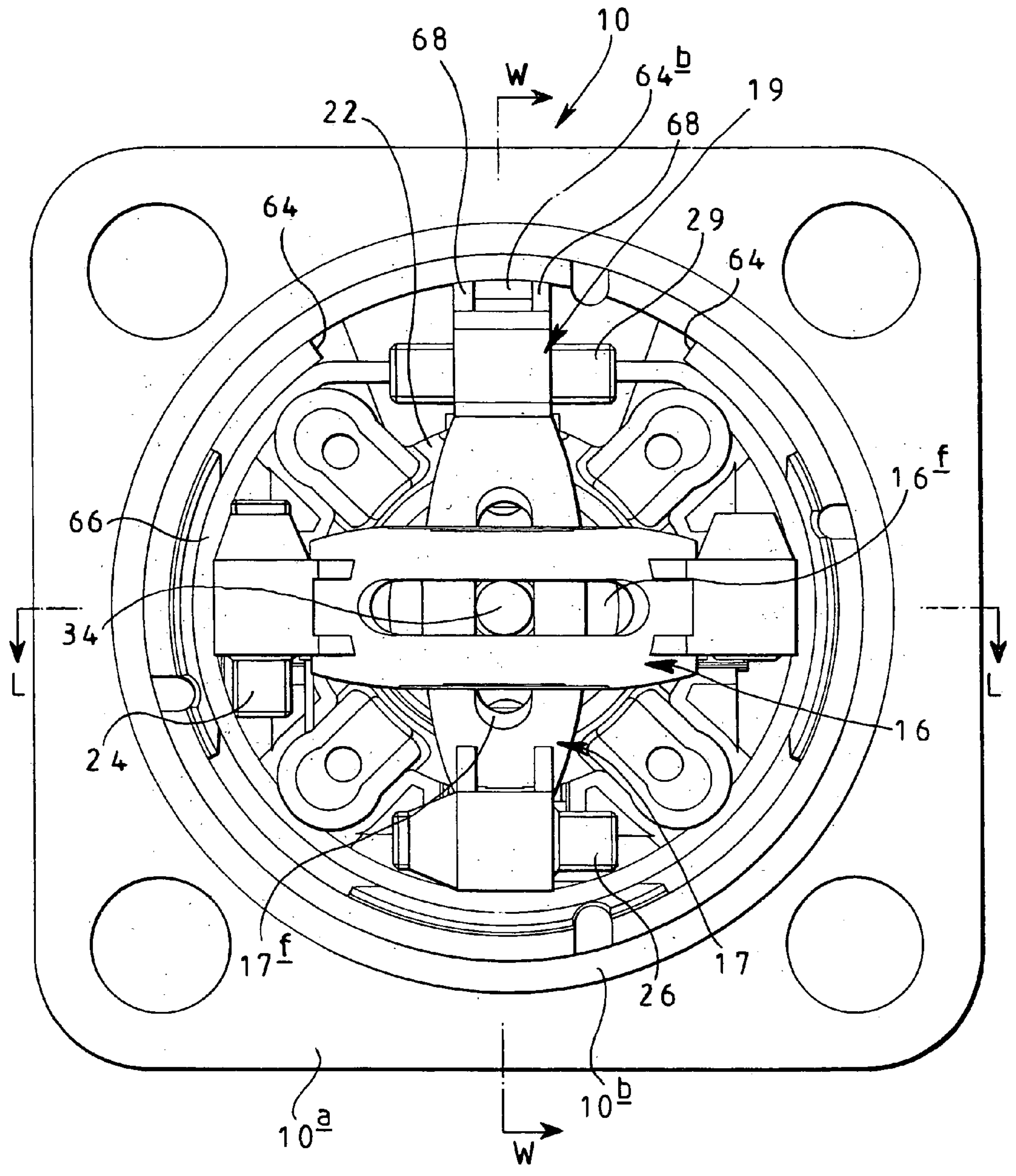
Figure 2:
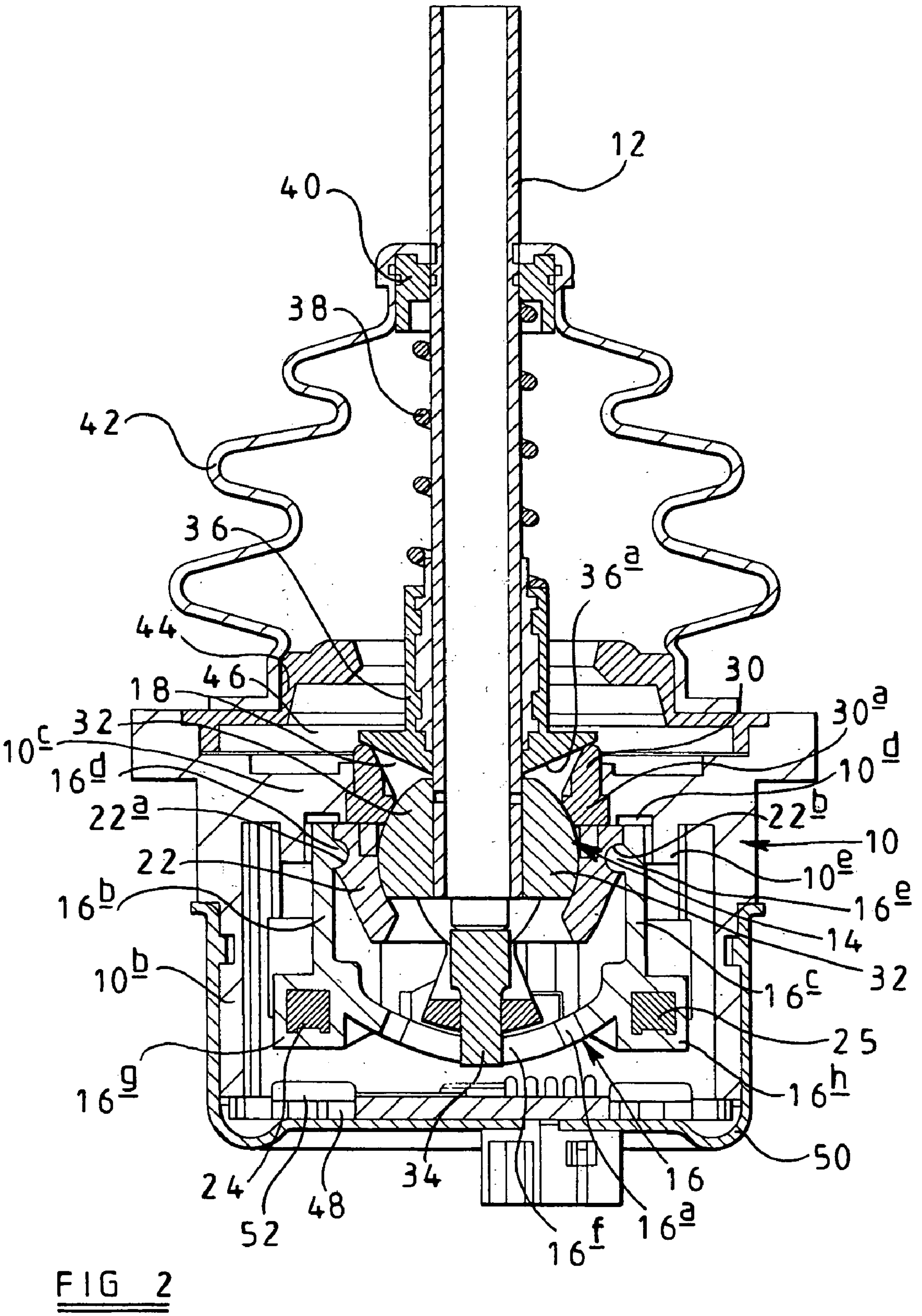
FIG. 2 is an axial section taken on the line L—L of FIG. 1 with the magnetic cover and printed circuit board in place.
Figure 3:
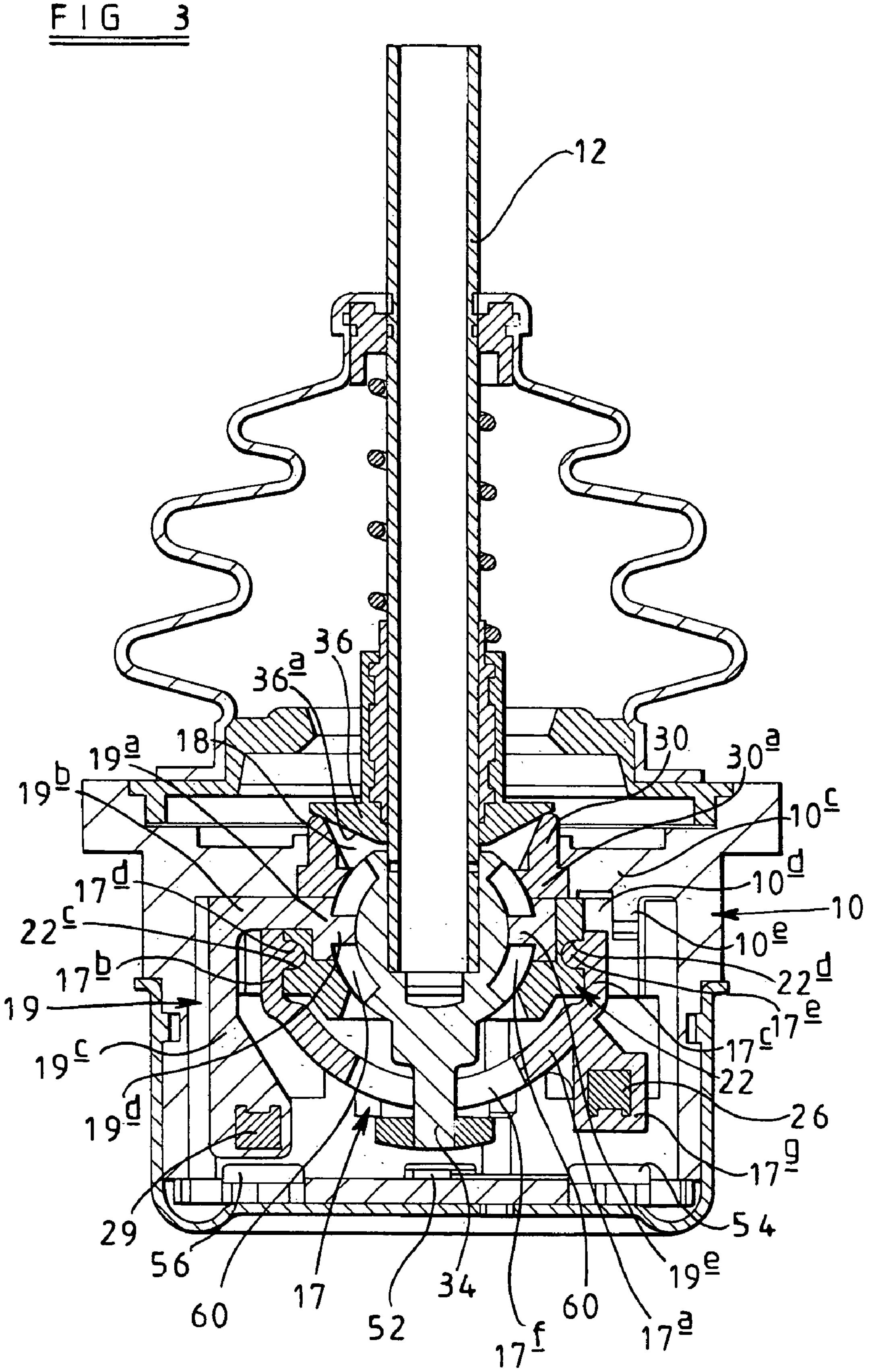
FIG. 3 is an axial section taken on the line W—W of FIG. 1 with the magnetic cover and printed circuit board in place.

Referring now to the FIGS. 1, 2 and 3, the joystick controller includes a diecast aluminium alloy body 10, a metal operating shaft 12 on which a handle (not shown) is mounted, a ball-and-socket joint 14, and first, second and third carrier members 16, 17 and 19. Instead of being formed of aluminium alloy, the body 10 may be formed of zinc alloy or a moulded polymer such as ABS or a glass-filled thermoplastic polyester or acetal resin.

The body 10 includes a mounting flange 10*a* and a sleeve 10*b* extending from the mounting flange 10*a*. The body 10 further includes an internal transverse wall 10*c* through which there is a central aperture 18. Integrally formed in that surface of the transverse wall 10*c* which faces the sleeve 10*b* is a square recess 10*d* bounded by a low wall 10*e*. The sleeve 10*b* has a series of four equi-spaced apertures (not shown) therethrough to provide clearance for magnets (to be described hereinafter) when they are at the ends of their travel.

An annular socket member 22 is secured within the square recess 10*d* by screws (not shown). In its outer surface, the socket member 22 has a series of four part spherical recesses 22*a*, 22*b*, 22*c* and 22*d*. The recesses 22*a* and 22*b* are illustrated in FIG. 2 and lie diametrically opposite one another. The recesses 22*c* and 22*d* are illustrated in FIG. 3 and lie diametrically opposite one another.

The aperture 18 in the transverse wall 10*c* has a collar 30 mounted therein. The axis of the collar 30 coincides with the longitudinal axis of the body 10. The ring 30 has a lower widened part 30*a* of part spherical or conical shape so as to form part of the socket of the ball-and-socket joint 14.

The first carrier member 16 is disposed within the sleeve 10*b* remote from the transverse wall 10*c*. The first member 16 has an arcuately curved transverse region 16*a* from each end of which extends a respective support leg 16*b*, 16*c*. The support legs 16*b* and 16*c* are mutually opposed and, have respective inwardly directed part-spherical pivot regions 16*d* and 16*e*. The pivot regions 16*d* and 16*e* are engaged with the respective recesses 22*a* and 22*b*. The support legs 16*b* and 16*c* have planar outer surfaces which are a close sliding fit against the adjacent region of the inner surface of the low wall 10*e*. Thus, it will be appreciated that rocking movement of the first member 16 relative to the body 10 and the socket member 22 is permitted about a first axis which passes through both of the pivot regions 16*d* and 16*e*.

The transverse region 16*a* of the first member 16 has a longitudinally extending slot 16*f* therethrough. At each end of the transverse region 16*a* there is provided a respective square section sleeve 16*g*, 16*h*. Each sleeve 16*g* and 16*h* carries a respective magnet 24, 25.

The second carrier member 17 is of similar construction to the first member 16 and similar parts are accorded equivalent references. Thus, the second member 17 has an arcuate transverse region 17*a* with longitudinal slot 17*f* therein, support legs 17*b* and 17*c*, part-spherical pivot regions 17*d*, 17*e*. However instead of being provided with two sleeves supporting respective magnets, it only possess one sleeve 17*g* and a single magnet 26 proximal to low wall 10*e*. Only one magnet is usually needed on each carrier member 16, 17, but a second magnet is provided on carrier member 16 in this embodiment and is used for applications which require independent outputs for integrity reasons. Thus, it will be appreciated that rocking movement of the second member 16 relative to the body 10 and the socket member 22 is permitted about a second axis which passes through both of the pivot regions 17*d* and 17*e* and which is perpendicular to the first axis.

The third carrier member 19 is also disposed within the sleeve 10*b* and situated on the opposite side of the sleeve 10*b* to the sleeve 17*g*. The third member 19 comprises an annular region 19*a* and a web region 19*b* which lie parallel to the transverse wall 10*c*, and a support arm 19*c* which is substantially perpendicular to the regions 19*a* and 19*b* and which is a close sliding fit with the sleeve 10*b*. The web region 19*b* connects the support arm 19*c* with the annular region 19*a* which encircles the ball 32 of the ball-and-socket joint 14. In this embodiment the annular region 19*a* is disposed between the transverse wall 10*c* and the annular socket member 22 so as to be pivotable relative thereto about the centre of the ball 32. The annular region has diametrically opposed, inwardly directed pivot regions 19*d* and 19*e* disposed on an axis passing through the pivot centre of the ball-and-socket joint 14. The support arm 19*c* carries a magnet 29 at its lower end.

The ball 32 is a part-spherical ball which engages the part-spherical wall 30*a* of the collar 30 and a part-spherical region of the annular socket member 22 so as to be universally pivotable relative thereto about its centre. The centre of the ball 32 lies on a third axis which, in this embodiment, is coincident with the longitudinal axis of the body 10. The third carrier member 19 rotates about the third axis which is also perpendicular to both of the first and second axes. The mutually perpendicular first and second axes about which the first and second carrier members 16 and 17 respectively rock also pass through the pivot centre of the ball 32. The inner end of the operating shaft 12 is anchored in a recess in the ball 32. Thus, universal pivotal movement of the ball 32 is effected by appropriate manipulation of a handle (not shown) mounted on the upper, outer end of the shaft 12. The inner surface of the collar 30 is outwardly flared away from the socket member 22 so as to increase the permitted degree of movement of the operating shaft 12. The socket member 22 serves to retain the ball 32 in place.

The ball 32 is provided with an operating member 34 which is aligned with the operating shaft 12 and which is unitary with the ball 32. The operating member 34 is of cylindrical form and projects through the slots 16*f* and 17*f* in the first and second carrier members 16 and 17. The operating member 34 has a diameter which is a close sliding fit in the width of the slots 16*f* and 17*f* so that the operating member 34 can slide longitudinally of the slots 16*f* and 17*f* when moved in the appropriate direction, as will be described hereinafter. The ball 32 is also provided with a pair of diametrically opposed grooves 60 extending in the direction of the longitudinal axis of the operating shaft. The cylindrical pivot regions 19*d* and 19*e* of the third carrier member 19 engage with the respective grooves 60 and form a close sliding fit. Thus rotation of the operating shaft 12 about its longitudinal axis causes the ball 32 to move the third carrier member 19 about the third axis by virtue of the engagement of the pivot regions 19*d* and 19*e* in the grooves 60.

Slidably mounted on the shaft 12 is a centering sleeve 36 having a frusto-conical surface 36*a* facing the collar 30. The frusto-conical surface 36*a* is urged into engagement with the collar 30 by means of a compression spring 38 which is lodged between the centering member 36 and an abutment 40 which is secured to an intermediate region of the operating shaft 12. The inner surface of the centering member 36 has a metallic liner to give an accurate low back lash sliding fit with the operating shaft 12 under all normal operating environmental conditions, particularly temperature extremes, and life.

The operating shaft 12 is maintained in a rotationally neutral position by means of a circular return spring 66 which extends around the longitudinal axis of the operating shaft internally of the sleeve 10*b*. The spring 66 has opposite ends 68 that engage with opposite sides of the support arm 19*c* of the third carrier member 19 and act to restore this, and thereby the operating shaft 12, to the neutral position. The operating shaft 12 has its arc of rotation limited by the provision of stops 64 on either side of the neutral position and stop 64*b* at the rotationally neutral position. In the embodiment shown, this rotation is limited to about 20 degrees either side of the neutral position. The stops 64 are disposed on the inner surface of the sleeve 10*b* in the path of movement of the support arm 19*c* of the third carrier member 19. The stop 64*b* is also disposed on the inner surface of the sleeve 10*b* and has opposed surfaces against which the opposite ends 68 of the spring 66 are respectively engaged.

A flexible gaiter 42 surrounds the lower end of the operating rod 12, the spring 38 and the centering member 36 and is secured in place on a ring 44 engaged in an upper recess 46 in the body 10. The upper end of the gaiter 42 is secured to the abutment 40 on the shaft 12.

The lower end of the sleeve 10*b* of the body 10 is closed by a planar printed circuit board 48 which is retained in place by locating pins (not shown) which may be riveted, formed or heat-staked for extra security. A cup-shaped end cap 50, made of magnetically soft material such as low carbon steel or nickel iron is adhesively fixed to, or snap-engaged with, the outer surface of the sleeve 10*b*.

The planar printed circuit board 48 carries first, second and third Hall-effect devices 52, 54 and 56 which are associated with the respective magnets 24, 26 and 29. The devices 52, 54 and 56 are mutually coplanar. It is within the scope of the present invention to provide additional Hall-effect devices to provide dual independent safety outputs on each axis for system integrity.

The printed circuit board 48 may also carry components (not shown) which may be used to ensure compliance with any Electro-Magnetic Compatibility (EMC) legislation that may be required. The printed circuit board 48 may also carry a connector to enable the joystick controller to be connected into external circuitry which it is intended to control, but in certain applications a direct cable connection may be used.

The Hall-effect devices 52, 54 and 56 have their sensitive axes perpendicular to the axes about which the respective magnets are arranged to rock or rotate as the case may be. The axis of polarisation of each magnet 24, 26, 29 (characterised by its north and south magnetic poles) is aligned perpendicular to the pivot axis of the carrier member to which it is attached.

In use, it will be appreciated that the action of the spring 38 on the centering member 36 and of spring 66 on the third carrier member 19 causes the operating shaft 12 to be urged into a central or null position as illustrated in FIGS. 2 and 3.

When the operating shaft 12 is moved in a plane perpendicular to FIG. 2, the operating member 34 engages the appropriate side of the slot 16*f* so as to pivot the first carrier member 16 about the first axis. This moves the magnet 24 relative to the closely adjacent Hall-effect device 52 which produces a signal output corresponding to the position of the magnet 24 and thus the position of the operating shaft 12 in the direction under consideration. During such movement of the operating shaft 12, the operating member 34 slides longitudinally in the slot 17*f* of the second carrier 17 so that no rocking motion of the latter occurs. Consequently, there is no movement of the magnet 26 relative to the Hall-effect device 54. There is also no movement of the third carrier member 19 as the shaft 12 is moved so as to effect movement of the carrier member 16. As the ball 32 moves, the position of the third carrier member 19 is maintained due to provision of the grooves 60 which slide longitudinally relative to the cylindrical pivot regions 19*d* and 19*e*. Accordingly there is no movement of the magnet 29 relative to the Hall-effect device 56.

Likewise, when the operating shaft 12 is moved perpendicular to the plane of FIG. 3, the operating member 34 slides longitudinally in slot 16*f* but is moved laterally of slot 17*f* with the result that the second member 17 is rocked about the second axis to cause movement of the magnet 26 relative to the Hall-effect device 54 to provide a signal output which is proportional to the amount of such movement of the operating shaft 12. There is no movement of the shaft 12 about its longitudinal axis, and the movement of the ball 32 about its centre of rotation is about the axis on which the pivot regions 19*d* and 19*e* lie and so no movement of the third carrier member 19 occurs.

When the operating shaft 12 is released, the spring 38 acting through the centering member 36 serves to move the operating rod and thereby the ball 32 and the operating member 34 into the null or centre position.

When the operating shaft is moved in a plane between the two above-mentioned planes, there is a proportional movement of both carrier members 16 and 17 to cause a corresponding change in the output signals from both Hall-effect devices 52 and 54, but still no movement of the third carrier 19 due to the positioning of the pivot regions 19*c* and 19*d* in the grooves 60.

Rotational movement of the operating shaft 12 about its longitudinal axis, against the action of the spring 66, causes rotation of the ball 32 and the operating member 34 about the longitudinal axis of the shaft 12, but results in no movement of either carrier member 16 or 17. However, the third operating member 19 connected to the ball 32 through pivot regions 19*d* and 19*e* and grooves 60 is caused to rotate about said third axis, resulting in movement of the third magnet 29 relative to the Hall-effect device 56, thus providing a signal output which is proportional to the amount of such rotational movement of the operating shaft 12. When the operating shaft 12 is released, it is returned to its neutral position by the restoring force of the spring 66 acting between the support arm 19*c* and the stop 64*b*.

The cup-shaped end cap 50 serves to protect the internal parts such as the first, second and third carrier members 16, 17 and 19, the magnets 24, 26 and 29 and the Hall-effect devices 52, 54 and 56 from physical and environmental damage. The flat closed end of the end cap 50 near to each of the devices 52, 54 and 56 acts as a pole piece concentrating the flux from the respective magnets in the direction of the sensitive axis of the devices 52, 54 and 56, thereby improving sensitivity and performance. The end cap 50 also acts to shield the Hall-effect devices 52, 54 and 56 from the effects of external magnetic fields and also reduces the amount of flux from the magnets appearing outside the joystick controller.

The operating member 34 is an insulator or is insulated from the operating shaft 12 so as to reduce the risk of radiated electromagnetic interference (EMI) or electrostatic discharge (ESD) being conducted along the operating shaft 12 to the printed circuit board 48. This also minimises any EMI from the Hall-effect devices 52, 54 and 56 being conducted to the outside environment.

Electrostatic discharges to the metal end cap 50 are conducted via a well defined static discharge path to an earthing conductor (not shown) in the connecting lead of the joystick and hence to system earth,. A high value resistor (e.g, 1 MΩ) in the static discharge path is provided in parallel with a high voltage breakdown device. The high value resistor permits lower voltage discharges of the static, but only at a low enough electrical current to avoid nuisance shocks. If the voltage is high enough, however, the high voltage breakdown device will conduct and reduce the high voltage rapidly. The high voltage breakdown device can be a non-linear resistor or semiconductor, or it can take the form of a small air gap (e.g. 0.2 to 0.5 mm) in the static discharge path. This gap can be made to break down before any other potential path within the controller by ensuring that all other potential paths have a larger air gap.

Figure 4:
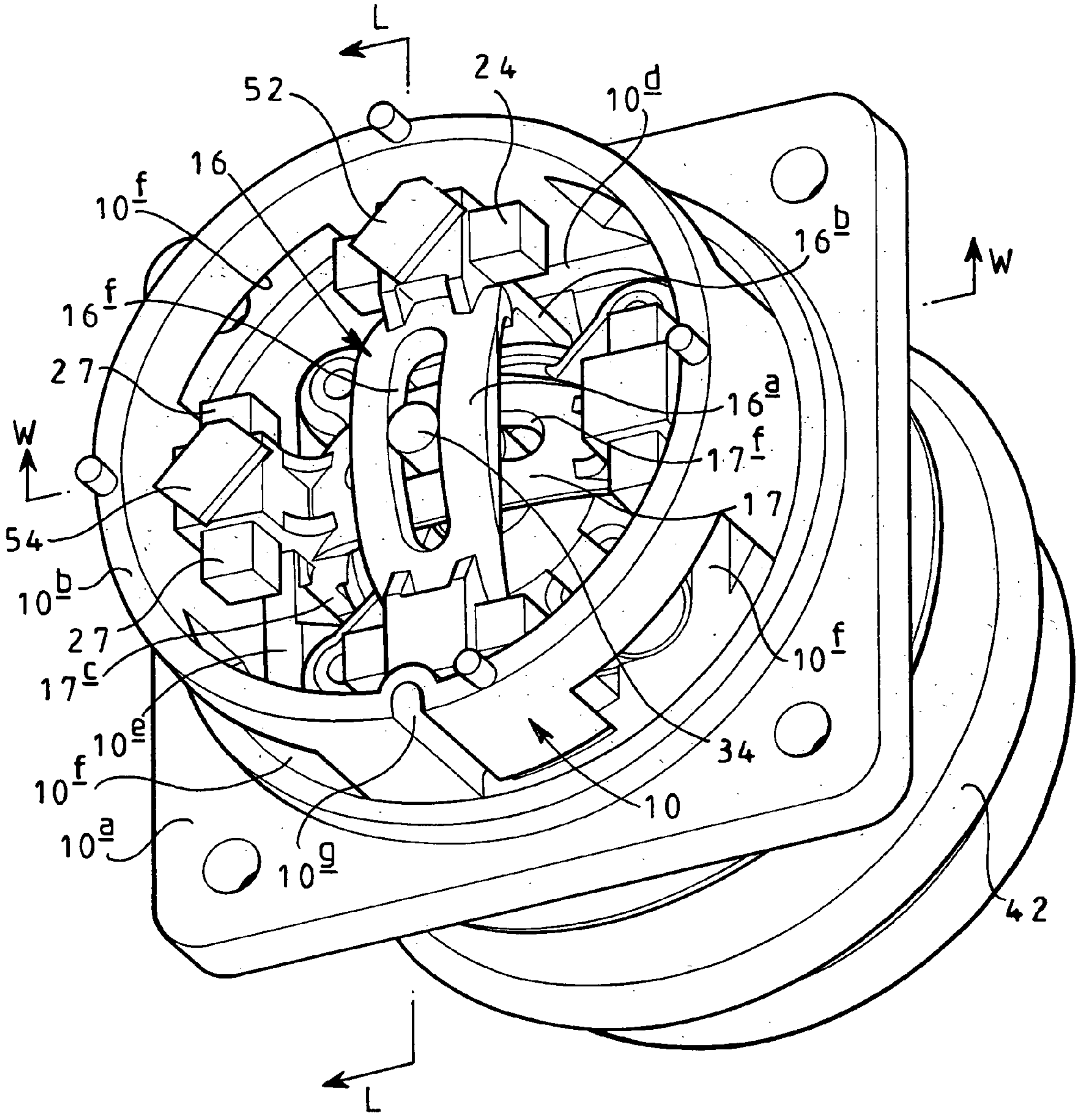
FIG. 4 is a perspective view of a joystick controller according to the second aspect of the present invention shown with a magnetic cover thereof removed.
Figure 5:
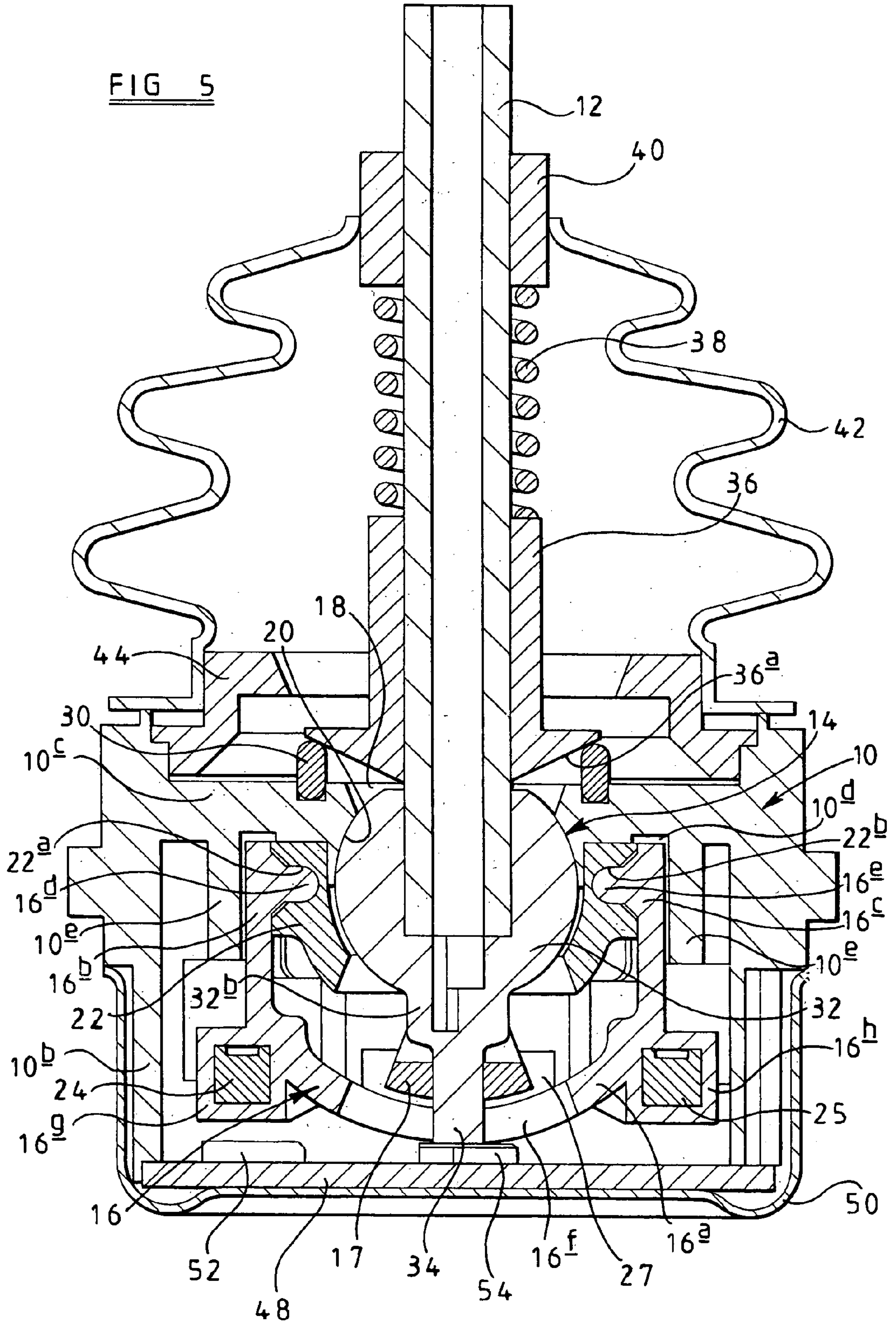
FIG. 5 is an axial section taken on the line L—L of FIG. 4.
Figure 6:
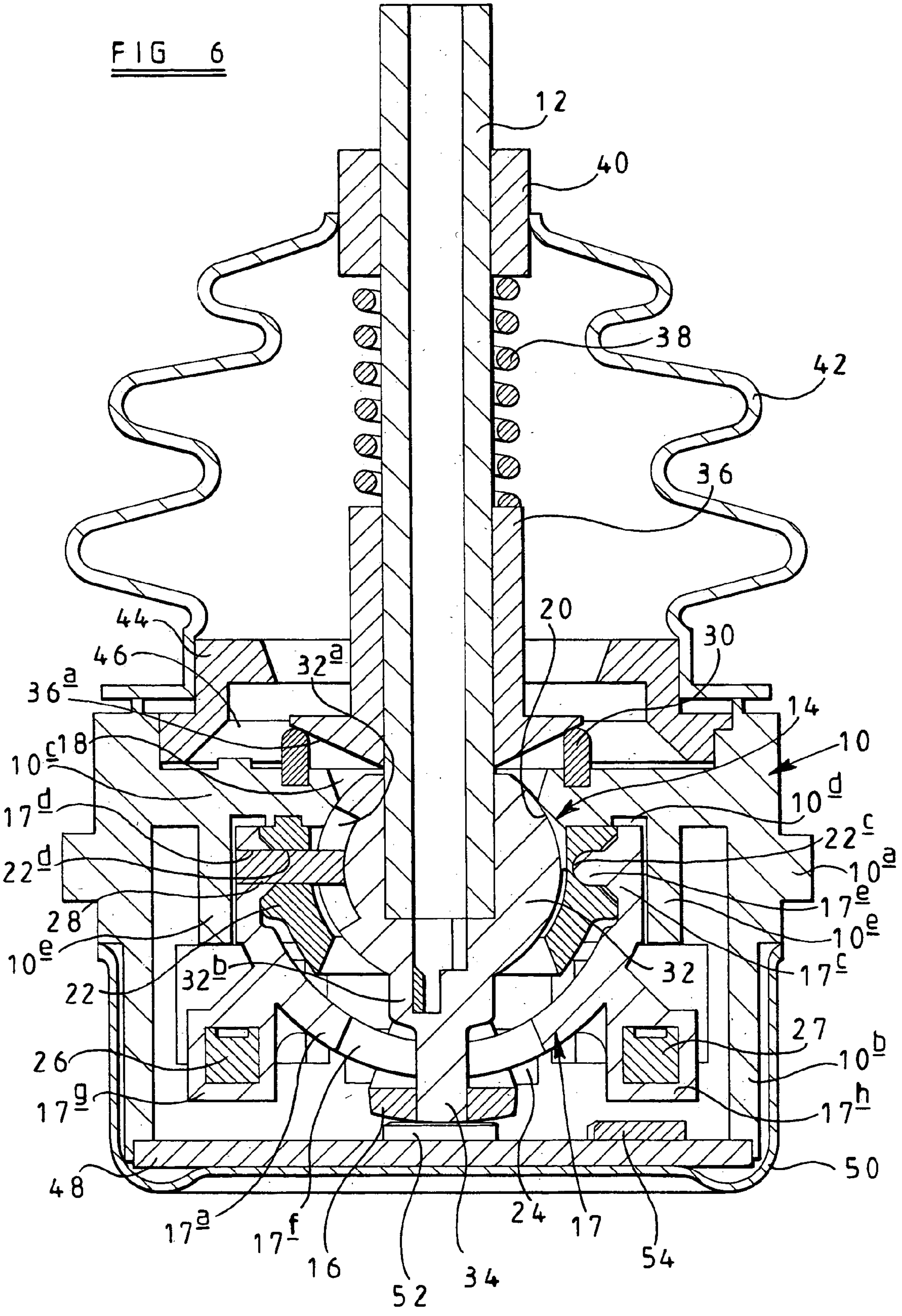
FIG. 6 is an axial section taken on the line W—W of FIG. 4.

Referring now to FIGS. 4, 5 and 6, the joystick controller is primarily intended for mounting on an arm of a motorised wheelchair to control movement of the latter.

The joystick controller includes a diecast aluminium alloy body 10, a hollow metal operating shaft 12 on which a handle (not shown) is mounted, a ball-and-socket joint 14, and first and second carrier members 16 and 17. Instead of being formed of aluminium alloy, the body 10 may be formed of zinc alloy or a moulded polymer such as ABS or a glass-filled thermoplastic polyester or acetal resin.

The body 10 includes a mounting flange 10*a* and a sleeve 10*b* extending from the mounting flange 10*a*. The body 10 further includes an internal transverse wall 10*c* through which there is a central aperture 18. A lower part 20 of the wall of the aperture 18 is of part-spherical or conical shape so as to form part of a socket of the ball-and-socket joint 14. Integrally formed in that surface of the transverse wall 10*c* which faces the sleeve 10*b* is a square recess 10*d* (see FIG. 5) bounded by a low wall 10*e* (see FIG. 6). The sleeve 10*b* has a series of four equi-spaced apertures 10*f* therethrough to provide clearance for magnets (to be described hereinafter) when they are at the ends of their travel.

An annular socket member 22 is secured within the square recess 10*d* by screws (not shown). In its outer surface, the socket member 22 has a series of three part spherical recesses 22*a*, 22*b* and 22*c*. The recesses 22*a* and 22*b* are illustrated in FIG. 5 and lie diametrically opposite one another. The recess 22*c* is illustrated in FIG. 6 and lies diametrically opposite a bore 22*d* through the socket member 22. The outer ends of the recesses 22*a*, 22*b* and 22*c* and of the bore 22*d* are outwardly frusto-conically flared.

The aperture 18 in the transverse wall 10*c* has a collar 30 mounted therein. The axis of the collar 30 has an annular recess therein receiving a ring 30 whose axis coincides with the longitudinal axis of the body 10.

The first carrier member 16 is disposed within the sleeve 10*b* adjacent the end of the latter remote from the transverse wall 10*c*. The first member 16 has an arcuately curved transverse region 16*a* from each end of which extends a respective support legs 16*b*, 16*c*. The support legs 16*b* and 16*c* are mutually opposed and have respective inwardly directed part-spherical pivot regions 16*d* and 16*e*. The pivot regions 16*d* and 16*e* are engaged with the respective recesses 22*a* and 22*b* and have frusto-conically shaped root regions for mating with the frusto-conically flared ends of the recesses 22*a* and 22*b*. The support legs 16*b* and 16*c* have planar outer surfaces which are a close sliding fit against the adjacent region of the inner surface of the low wall 10*e*. Thus, it will be appreciated that rocking movement of the first member 16 relative to the body 10 and the socket member 22 is permitted about a first axis which passes through both of the pivot regions 16*d* and 16*e*.

The transverse region 16*a* of the first member 16 has a longitudinally extending slot 16*f* therethrough. At each end of the transverse region 16*a* there is provided a respective square section sleeve 16*g*, 16*h*. Each sleeve 16*g* and 16*h* carries a respective magnet 24, 25.

The second carrier member 17 is of similar construction to the first member 16 and similar parts are accorded equivalent references. Thus, the second member 16 has an arcuate transverse region 17*a* with longitudinal slot 17*f* therein, support legs 17*b* and 17*c*, part-spherical pivot region 17*e*, and sleeves 17*g* and 17*h* supporting respective magnets 26 and 27. However, instead of being provided with another pivot region like pivot region 16*d*, the second member 17 is provided with a bore 17*d* which is aligned with the bore 22*d* and which supports a transverse pin 28. The pin 28 projects through the bore 22*d* so as to protrude from the inner surface of the socket member 22. Only one magnet is usually needed on each carrier member 16, 17, but the second magnet is provided in this embodiment and is used for applications which require independent outputs for integrity reasons. It will be appreciated that rocking movement of the second member 17 relative to the body 10 and the socket member 22 is permitted about a second axis which (i) passes through the pivot region 17*e*, (ii) is coincident with the longitudinal axis of the pin 28 and (iii) is perpendicular to the first axis.

The ball 32 is a part-spherical ball which engages the part-spherical wall 20 of the aperture 18 and a part-spherical region of the annular socket member 22 so as to be universally pivotable relative thereto about its centre. The centre of the ball 32 lies on the longitudinal axis of the body 10. The mutually perpendicular first and second axes about which the first and second carrier members 16 and 17 respectively rock pass through the pivot centre of the ball 32. The inner end of the operating shaft 12 is anchored in a recess in the ball 32. Thus, universal pivotal movement of the ball 32 is effected by appropriate manipulation of a handle (not shown) mounted on the upper, outer end of the shaft 12. The inner surface of the collar 30 is outwardly flared away from the socket 22 so as to increase the permitted degree of movement of the operating shaft 12. The socket member 22 serves to retain the ball 32 in place.

If desired, the handle on the end of the operating shaft may be rotatable relative to the shaft so as to enable a switch or the like to be controlled. However, it is also possible to adapt the end of the shaft 12 so that it is capable to receiving a variety of different types of handle or operating knob.

The ball 32 is provided with an operating member 34 which is aligned with the operating shaft 12 and which is unitary with the ball 32. The operating member 34 is of cylindrical form and projects through the slots 16*f* and 17*f* in the first and second carrier members 16 and 17. The operating member 34 has a diameter which is a close sliding fit in the width of the slots 16*f* and 17*f* so that the operating member 34 can slide longitudinally of the slots 16*f* and 17*f* when moved in the appropriate direction, as will be described hereinafter.

Slidably mounted on the shaft 12 is a centering sleeve 36 having a frusto-conical surface 36*a* facing the collar 30. The frusto-conical surface 36*a* is urged into engagement with the collar 30 by means of a compression spring 30*a* which is lodged between the centering member 36 and an abutment 40 which is secured to an intermediate region of the operating shaft 12. The inner surface of the centering member 36 has a metallic liner to give an accurate low back lash sliding fit with the operating shaft 12 under all normal operating environmental conditions, particularly temperature extremes, and life. However, for very low cost applications, the liner may be omitted.

A flexible gaiter 42 surrounds the lower end of the operating rod 12, the spring 38 and the centering member 36 and is secured in place on a ring 44 engaged in an upper recess 46 in the body 10. The upper end of the gaiter 42 is secured to the abutment 40 on the shaft 12.

The lower end of the sleeve 10*b* of the body 10 is closed by a planar printed circuit board 48 which is retained in place by locating pins (not shown) which may be riveted, formed or heat-staked for extra security. A cup-shaped end cap 50, made of magnetically soft material such as low carbon steel or nickel iron is adhesively fixed to, or snap-engaged with, the outer surface of the sleeve 10*b*.

The planar printed circuit board 48 carries first and second Hall-effect devices 52 and 54 which are associated with the respective magnets 24 and 27. The devices 52 and 54 are mutually coplanar. In this embodiment, the other magnets 25 and 26 are not used. However, it is within the scope of the present invention to provide additional Hall-effect devices associated with these magnets 25 and 26 to provide dual independent safety outputs on each axis for system integrity.

The printed circuit board 48 may also carry components (not shown) which may be used to ensure compliance with any Electro-Magnetic Compatibility (EMC) legislation that may be required. The printed circuit board 48 may also carry a connector to enable the joystick controller to be connected into external circuitry which it is intended to control, but in certain applications a direct cable connection may be used.

The Hall-effect devices 52 and 54 have their sensitive axes perpendicular to the axes about which the respective magnets 24 and 27 are arranged to rock. The axis of polarisation of each magnet 24, 27, (characterised by its north and south magnetic poles) is aligned perpendicular to the pivot axis of the carrier member to which it is attached.

In use, it will be appreciated that the action of the spring 38 on the centering member 36 causes the operating shaft 12 to be urged into a central or null position as illustrated in FIGS. 5 and 6.

When the operating shaft 12 is moved in a plane perpendicular to FIG. 5, the operating member 34 engages the appropriate side of the slot 16*f* so as to pivot the first carrier member 16 about the first axis. This moves the magnet 24 relative to the closely adjacent Hall-effect device 52 which produces a signal output corresponding to the position of the magnet 24 and thus the position of the operating shaft 12 in the direction under consideration. During such movement of the operating shaft 12, the operating member 34 slides longitudinally in the slot 17*f* of the second carrier 17 so that no rocking motion of the latter occurs. Consequently, there is no movement of the magnet 27 relative to the Hall-effect device 54.

Likewise, when the operating shaft 12 is moved perpendicular to the plane of FIG. 6, the operating member 34 slides longitudinally in slot 16*f* but is moved laterally of slot 17*f* with the result that the second member 17 is rocked about the second axis to cause movement of the magnet 27 relative to the Hall-effect device 54 to provide a signal output which is proportional to the amount of such movement of the operating shaft 12.

When the operating shaft 12 is released, the spring 38 acting through the centering member 36 serves to move the operating rod and thereby the ball 32 and the operating member 34 into the null or centre position.

When the operating shaft is moved in a plane between the two above-mentioned planes, there is a proportional movement of both carrier members 16 and 17 to cause a corresponding change in the output signals from both Hall-effect devices 52 and 54.

In this embodiment rotation of the operating shaft 12 about its longitudinal axis is prevented because the pin 28 engages in slot 32*a*. Slot 32*a* is arcuate and centred on the centre point of the ball 32, with the longitudinal dimension of the slot lying in the same plane as that of the slot 17*f*. The provision of the slot 32*a* permits pivoting movement of the operating shaft 12 in a direction to rock the first carrier member 16.

The cup-shaped end cap 50 serves to protect the internal parts such as the first and second carrier members 16, the magnets 24 to 27, and the Hall-effect devices 52 and 54 from physical and environmental damage. The flat closed end of the end cap 50 near to each of the devices 52 and 54 acts as a pole piece concentrating the flux from the respective magnets in the direction of the sensitive axis of the devices 52 and 54, thereby improving sensitivity and performance. The end cap 50 also acts to shield the hall-effect devices 52 and 54 from the effects of external magnetic fields and also reduces the amount of flux from the magnets appearing outside the joystick controller.

The operating member 34 is an insulator or is insulated from the operating shaft 12 so as to reduce the risk of radiated electromagnetic interference (EMI) or electrostatic discharge (ESD) being conducted along the operating shaft 12 to the printed circuit board 48. This also minimises any EMI from the Hall-effect devices 52 and 54 being conducted to the outside environment.

Electrostatic discharges to the metal end cap 50 are conducted via a well defined static discharge path to an earthing conductor (not shown) in the connecting lead of the joystick and hence to system earth. A high value resistor (e.g, 1 MΩ) in the static discharge path is provided in parallel with a high voltage breakdown device. The high value resistor permits lower voltage discharges of the static, but only at a low enough electrical current to avoid nuisance shocks. If the voltage is high enough, however, the high voltage breakdown device will conduct and reduce the high voltage rapidly. The high voltage breakdown device can be a non-linear resistor or semiconductor, or it can take the form of a small air gap (e.g. 0.2 to 0.5 mm) in the static discharge path. This gap can be made to break down before any other potential path within the controller by ensuring that all other potential paths have a larger air gap.

It is within the scope of the present invention for one or more switches or controls to be mounted in the operating knob and for connections to them to be via a cable passing through the hollow operating shaft (12). This cable (not shown) passes through the operating shaft 12 from the handle and exits through a slot (not shown) in cylindrical extension 32*b* to the ball 32. From there, the cable is coiled around the extension 32*b* for strain relief and then passes under a clip (not shown) in the body 10 before passing through one of the apertures 10*f* in the sleeve 10*b*. From there, the cable passes along L-shaped recess 10*g* in the sleeve 10*b* for connection to the printed circuit board 48.

This cable introduces a potential ESD or EMC path from the handle mounted electrical components. In order to prevent damage to the sensitive electronic parts of the joystick controller via this route, these components may be well insulated and provided with RF decoupling components and an earthing conductor (not shown) provided in the form of a dedicated wire in this cable to provide a suitable discharge path for static build-up.

However, it is within the scope of the present invention, when there is no need to provide sensors in the handle, to use a solid operating shaft.

In the above described embodiments, the axes about which the first, second and third carrier members 16, 17 and 19 are coincident with the pivot centre of the ball-and-socket joint 14. However, it is within the scope of the present invention for any of these axes to be slightly offset from this pivot centre by an amount which does not have a material effect on successful operation of the joystick. For example, it may be convenient from a constructional standpoint for the axis about which the second carrier member 17 is pivotable to be displaced one or two mm below the pivot centre (as shown in FIG. 3).

The invention claimed is:

1. A joystick controller comprising:

a body;

an operating shaft having a longitudinal axis;

means for mounting the operating shaft for universal pivotal movement relative to the body about a pivot centre;

a first member mounted for movement by the operating shaft relative to the body about a first axis;

a second member mounted for movement by the operating shaft relative to the body about a second axis which is substantially perpendicular to the first axis;

a third member mounted for movement relative to the body about a third axis substantially perpendicular to the first and second axes upon rotation of the operating shaft about its longitudinal axis;

first detecting means for producing an output signal indicative of the position of the first member about the first axis;

second detecting means for producing an output signal indicative of the position of the second member about the second axis; and third detecting means for producing an output signal indicative of the position of the third member about the said third axis;

wherein at least one of the first, second and third detecting means is a non-contact detecting means fixed relative to the body.

2. A joystick controller as claimed in claim 1, wherein the means for mounting the operating shaft comprises a ball-and-socket joint.

3. A joystick controller according to claim 2, in which part of the ball-and-socket joint is movable with the operating shaft about the longitudinal axis of the latter and forms part of connecting means operatively connecting the operating shaft with the third member.

4. A joystick controller according to claim 3, in which the connecting means comprises an interengaging pin and groove arrangement.

5. A joystick controller according to claim 3, in which the connecting means comprises a pair of interengaging pin and groove arrangements which are disposed on diametrically opposite sides of the ball-and-socket joint.

6. A joystick controller according to claim 4, in which the groove of the pin and groove arrangement is provided in the ball.

7. A joystick controller according to claim 5, in which the groove of each pin and groove arrangement is provided in the ball.

8. A joystick controller according to claim 3, in which the connecting means are arranged so that movement of the third member about the third axis is independent of the position of the operating shaft in relation to the first and second axes.

9. A joystick controller according to claim 1, in which the operating shaft is rotatable by approximately 20° either side of a neutral rotary position.

10. A joystick controller according to claim 9, in which stop means are provided for limiting rotary movement of the operating shaft on either side of the neutral rotary position.

11. A joystick controller according to claim 9, in which means are provided for resiliently restoring the operating shaft to its neutral rotary position after rotary movement of said shaft.

12. A joystick controller according to claim 11, in which the resilient restoring means includes a return spring.

13. A joystick controller according to claim 12, in which the return spring is curved so as to extend around the longitudinal axis of the operating shaft and has opposite ends which engage with the third member.

14. A joystick controller according to claim 1, in which the first, second and third members include first, second and third magnets, and the first, second and third detecting means comprise first, second and third magnetic field sensing devices in operative proximity to the respective first, second and third magnets.

15. A joystick controller according to claim 14, in which said magnetic field sensing devices are mounted within a magnetically soft cup-shaped member or cover engaged with the body.

16. A joystick controller according to claim 1, in which the first, second and third detecting means include electrical field sensing devices.

17. A joystick controller according to claim 1, in which connecting means operatively connects the operating shaft to the first and second members and is formed of an insulator or is insulated from the operating shaft.

18. A joystick controller according to claim 1, in which restoring means are provided for resiliently restoring the operating shaft to a neutral position about the pivot axis.

19. A joystick controller according to claim 18, in which said restoring means comprises a member slidable on the shaft and having a frusto-conical surface resiliently urged against an annular formation on the body.

20. A joystick controller according to claim 18, in which the restoring means has a metallic liner.

21. A joystick controller according to claim 1, in which the first, second and third detecting means are mounted on a substantially planar support.

22. A joystick controller according to claim 21, in which the planar support comprises a printed circuit board.

23. A joystick controller comprising:

a body;

an operating shaft having a longitudinal axis;

means mounting the operating shaft for universal pivotal movement relative to the body about a pivot centre;

a first member mounted for movement by the operating shaft relative to the body about a first axis which passes through the pivot centre;

a second member mounted for movement by the operating shaft relative to the body about a second axis which is substantially perpendicular to the first axis; and a substantially planar printed circuit board comprising:

first detecting means for producing an output signal indicative of the position of the first member about the first axis; and second detecting means for producing an output signal indicative of the position of the second member about the second axis;

wherein said first and second detecting means are non-contact sensing devices.

24. A joystick controller as claimed in claim 23, wherein the means for mounting the operating shaft for universal pivotal movement relative to the body (10) about a pivot centre is a ball-and-socket joint.

25. A joystick controller according to claim 23, in which the said first and second detecting means are magnetic field sensing devices mounted within a magnetically soft cup-shaped member or cover engaged with the body.

26. A joystick controller according to claim 23, in which connecting means operatively connects the operating shaft to the first and second members and is formed of an insulator or is insulated from the operating shaft.

27. A joystick controller according to claim 23, in which restoring means are provided for resiliently restoring the operating shaft to a neutral position about the pivot axis.

28. A joystick controller according to claim 27, in which said restoring means comprises a member slidable on the shaft and having a frusto-conical surface resiliently urged against an annular formation on the body.

29. A joystick controller according to claim 27, in which the restoring means has a metallic liner.

30. A joystick controller according to claim 27, wherein said first and second detecting means are non-contact sensing devices.

31. A joystick controller comprising:

a body;

an operating shaft having a longitudinal axis;

a ball and socket arrangement, the ball being mounted on the operating shaft and the socket mounted in the body, thereby facilitating universal pivotal movement of the operating shaft relative to the body about a pivot centre;

a first member mounted for movement by the operating shaft relative to the body about a first axis which passes through the pivot centre;

a second member mounted for movement by the operating shaft relative to the body about a second axis which is substantially perpendicular to the first axis;

first detecting means for producing an output signal indicative of the position of the first member about the first axis; and second detecting means for producing an output signal indicative of the position of the second member about the second axis; and restoring means for resiliently restoring the operating shaft to a neutral position about the pivot axis, said restoring means comprising a member slidable on the shaft and having a frusto-conical surface resiliently urged against a collar mounted in the body, the collar having a part-spherical region which engages with a part-spherical region of the ball.

* * * * *